United States Patent
O'Brien et al.

(10) Patent No.: US 11,011,683 B2
(45) Date of Patent: May 18, 2021

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: David O'Brien, Portland, OR (US); Norwin von Malm, Nittendorf (DE); Jörg Frischeisen, Schwabmünchen (DE); Angela Eberhardt, Augsburg (DE); Florian Peskoller, Ingolstadt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/484,767

(22) PCT Filed: Feb. 23, 2018

(86) PCT No.: PCT/EP2018/054549
§ 371 (c)(1),
(2) Date: Aug. 8, 2019

(87) PCT Pub. No.: WO2018/158161
PCT Pub. Date: Sep. 7, 2018

(65) Prior Publication Data
US 2020/0006602 A1    Jan. 2, 2020

(30) Foreign Application Priority Data

Feb. 28, 2017    (DE) .................. 102017104127.3

(51) Int. Cl.
*H01L 33/50* (2010.01)
*H01L 33/00* (2010.01)
(Continued)

(52) U.S. Cl.
CPC ........ *H01L 33/504* (2013.01); *H01L 33/0075* (2013.01); *H01L 33/32* (2013.01); *H01L 33/44* (2013.01); *H01L 2933/0041* (2013.01)

(58) Field of Classification Search
CPC .................... H01L 33/504; H01L 33/0075
See application file for complete search history.

(56) References Cited

U.S. PATENT DOCUMENTS

| 10,115,871 B2 | 10/2018 | Linkov et al. |
| 10,297,727 B2 | 5/2019 | Stoll et al. |

(Continued)

FOREIGN PATENT DOCUMENTS

| DE | 10162223 A1 | 8/2002 |
| DE | 102007057812 A1 | 6/2009 |

(Continued)

*Primary Examiner* — Thomas L Dickey
(74) *Attorney, Agent, or Firm* — Slater Matsil, LLP

(57) ABSTRACT

An optoelectronic component and a method for producing an optoelectronic component are disclosed. In an embodiment, an optoelectronic component includes a semiconductor layer sequence having an active region configured to emit radiation at least via a main radiation exit surface and a conversion element arranged directly downstream of the main radiation exit surface, wherein the conversion element is substrate-free and includes a first layer, wherein the first layer includes at least one conversion material embedded in a matrix material, wherein the matrix material includes at least one condensed inorganic sol-gel material selected from the following group consisting of water glass, metal phosphate, aluminum phosphate, modified monoaluminum phosphate, monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane, metal oxide, metal silicates, metal sulfates, and tungstates, and wherein the (Continued)

condensed sol-gel material has a proportion between 10 and 70 vol % in the first layer.

20 Claims, 4 Drawing Sheets

(51) Int. Cl.
  *H01L 33/32*  (2010.01)
  *H01L 33/44*  (2010.01)

(56) References Cited

U.S. PATENT DOCUMENTS

| | | | |
|---|---|---|---|
| 10,297,729 B2 | 5/2019 | Eberhardt et al. | |
| 2015/0123156 A1* | 5/2015 | Eberhardt | H01L 33/483 257/98 |
| 2018/0198034 A1 | 7/2018 | O'Brien et al. | |

FOREIGN PATENT DOCUMENTS

| | | |
|---|---|---|
| DE | 102005012953 B4 | 11/2012 |
| DE | 102012210083 A1 | 12/2013 |
| DE | 102012110668 A1 | 5/2014 |
| DE | 102012220980 A1 | 5/2014 |
| DE | 102015101143 A1 | 7/2016 |
| DE | 102015113052 A1 | 2/2017 |
| EP | 2302708 A2 | 3/2011 |

* cited by examiner

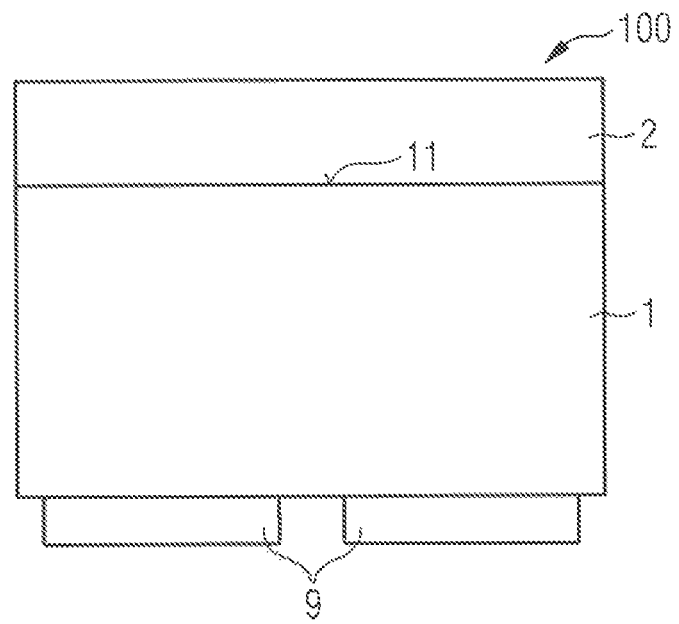
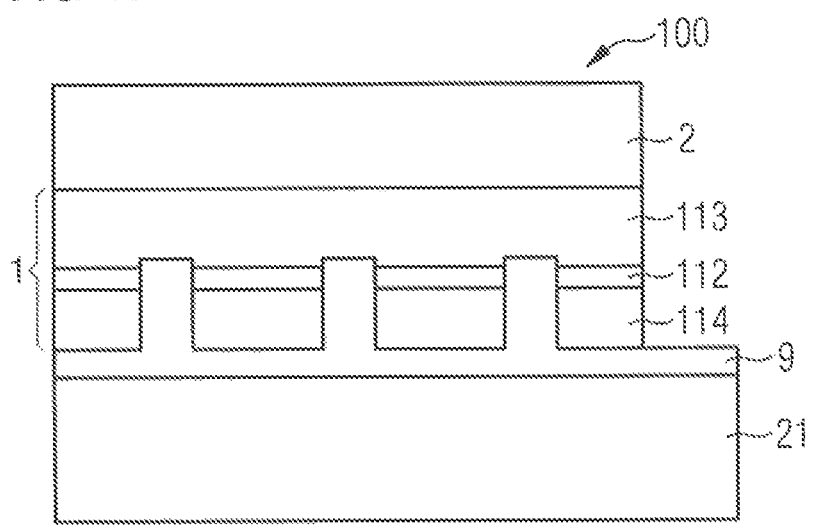

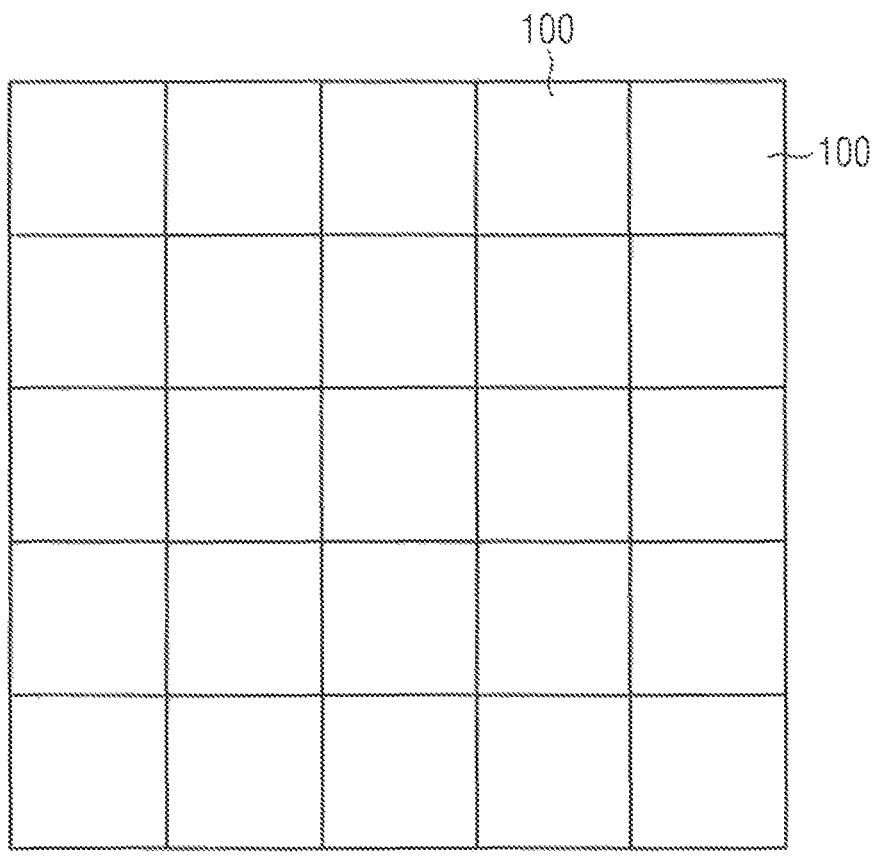

OPTOELECTRONIC COMPONENT AND METHOD FOR PRODUCING AN OPTOELECTRONIC COMPONENT

This patent application is a national phase filing under section 371 of PCT/EP2018/054549, filed Feb. 23, 2018, which claims the priority of German patent application 102017104127.3, filed Feb. 28, 2017, each of which is incorporated herein by reference in its entirety.

TECHNICAL FIELD

The invention relates to an optoelectronic component. Furthermore, the invention relates to a method for producing an optoelectronic component.

BACKGROUND

Optoelectronic components, such as light emitting diodes (LEDs), usually have a conversion element to convert the radiation emitted by a semiconductor layer sequence of the component, preferably from the blue spectral range, into white mixed light. These converter elements typically comprise silicone and at least one conversion material. The silicone is used as a matrix material. Silicone, however, has the disadvantage that it will turn yellow when exposed to radiation from the blue spectral range. In addition, it has low thermal mechanical properties that can lead to degradation of the matrix material. The silicone as a matrix material is therefore the limiting factor for the operation of an optoelectronic component, especially for its lifetime.

Other inorganic converters, for example, a ceramic converter or a phosphor-in-glass converter, are usually attached to the semiconductor layer sequence using an adhesive. Silicone is preferably used as an adhesive, but it also has the disadvantages of limiting lifetime described above in this function. The low thermal conductivity and high permeability of the silicone also limit the operating parameters of an optoelectronic component. The adhesion of silicone to the various materials to be bonded can be poor and lead to delamination of the converter element during production.

SUMMARY OF THE INVENTION

Embodiments provide optoelectronic components being stable against high temperatures, humidity and radiation. Further embodiments provide optoelectronic components being operable at higher powers and being able to be produced in a similar color location diversity and a high color rendering index (CRI) as with a silicone matrix. Yet other embodiments provide a method for producing an optoelectronic component that produces an optoelectronic component with improved properties.

In at least one embodiment, the optoelectronic component comprises a semiconductor layer sequence. The semiconductor layer sequence comprises an active region. The active region is configured to emit radiation at least via a main radiation exit surface during operation. The component comprises a conversion element that at least partially converts the emitted primary radiation into a secondary radiation. The conversion element is arranged directly and in particular without additional adhesive layer on the main radiation exit surface, i.e., directly downstream of the main radiation exit surface. The conversion element is substrate-free. The conversion element comprises a first layer. The first layer comprises a conversion material which is embedded in a matrix material. The matrix material comprises at least one condensed inorganic sol-gel material. The sol-gel material is selected from the following group: Water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane, metal oxide, metal silicates, metal sulfates, tungstates. In particular, the sol-gel material is: water glass, metal phosphate, aluminum phosphate, modified monoaluminum phosphate and/or monoaluminum phosphate. The condensed sol-gel material has a proportion between 10 vol % and 70 vol % in the first layer. The proportion of condensed sol-gel material is based on the total volume of sol-gel material and conversion material and, where appropriate, hardener, filler, or other solid additives, but without any pores that may form.

Sol-gel materials are referred to here and in the following as those materials which are produced by means of a sol-gel process. The sol-gel process is a process for the production of inorganic or hybrid polymer materials from colloidal dispersions, the so-called sols. The starting materials are also referred to as precursor materials. In a first basic reaction, finest particles are formed from them in solution. Through the special further processing of the sols, powders, fibers, layers or aerogels can be produced. The essential basic process of the sol-gel process is the hydrolysis of the precursor materials and the condensation between the resulting reactive species. The sol-gel process is sufficiently well known to a person skilled in the art and is not explained in more detail.

As a sol-gel material is in principle any metal oxide conceivable, but preferably zinc oxide, tin oxide, aluminum oxide, titanium oxide, hafnium oxide, zirconium oxide, gallium oxide, yttrium oxide and/or silicon oxide, which can be produced by the sol-gel process. The best known is the generation of silicon dioxide, for example, as a layer via the sol-gel process. The sol may be embedded in a solvent such as water, a primary or secondary alcohol such as ethanol or isopropanol, or other polar organic solvents. A mixture of the sol-gel materials described here can also be used. The sol-gel material is preferably heat up to a temperature lower than or equal to 350° C., in particular lower than or equal to 300° C. or preferably lower than or equal to 150° C., in order, for example, not to thermally damage the semiconductor layer sequence during the curing of the sol-gel material.

For example, inorganic sol-gel materials such as certain aluminum phosphates, modified monoaluminum phosphate (MALP) or monoaluminum phosphate can be cured at a temperature of less than or equal to 350° C., in particular less than 350° C., preferably less than or equal to 300° C., or potassium water glass (KWG) at less than or equal to 350° C., in particular less than or equal to 300° C., in particular less than or equal to 150° C., or preferably less than 150° C. Sodium (NaWG) or lithium water glass (LiWG) or a mixture of several water glasses can also be cured at these temperatures. In order to achieve good chemical resistance, such as good humidity stability at temperatures of 85° C., 85 percent relative humidity and 1000 hours, for example, these materials described above should be cured at such temperatures. As an option, chemical hardeners can also be added to the matrix materials, especially the water glasses, in order to increase the moisture stability.

The inventors have recognized that it is precisely the use of the conversion element described above with the inorganic matrix material made from an inorganic sol-gel that leads to components with advantageous properties. A matrix of organic sol gels is also conceivable, but not preferred, as these normally require higher curing temperatures, usually >400° C., in order to fully react and thus become chemically stable. Since the semiconductor layer sequence, for example, can already be thermally damaged at these temperatures, the sol-gel is hardened preferably at lower hardening temperatures, but the matrices of organic sol-gels are then not chemically stable enough.

A particular advantage of the inorganic matrix is that the components can be produced in a composite on an epitaxial substrate (wafer) and then separated. This is due to the fact that the conversion layer can be applied and hardened directly on the wafer on the one hand and on the other hand that the inorganic matrix allows separating by, for example, sawing with good cutting edge quality. The latter is not possible with silicone, as it is too soft, which gives the inorganic matrix the additional advantage of a more cost-effective producing process.

So far, only inorganic converters such as ceramic converters or inorganic converter elements containing substrates are known. During production, these conventional conversion elements are individually applied to the semiconductor layer sequence of the component by means of an adhesive. Silicone, for example, is required as an adhesive, which leads to the disadvantages described above. The inventors are of the opinion that at present no components are known which consist exclusively of inorganic materials and thus exhibit good thermomechanical stability. At the same time, the component can be produced more cost-effectively at wafer level and can be operated at higher powers compared to a component with a silicone matrix, whereby a similar color location diversity and a high color rendering index (CRI) is possible as with a silicone matrix.

According to at least one embodiment, the conversion element is arranged directly on the main radiation exit surface without an adhesive. In other words, the conversion element adheres to the main radiation exit surface without an adhesive.

According to at least one embodiment, the conversion element is free of an organic material. Preferably, the optoelectronic component is free of an organic material at least in the direction of radiation; this means there is no organic material above the main radiation exit surface. However, organic material can be used as package material and/or as potting material, for example, filled with $TiO_2$, around the semiconductor layer sequence or around the edges of the conversion element.

According to at least one embodiment, the optoelectronic component is free of an organic adhesive such as silicone or epoxy.

According to at least one embodiment, the semiconductor layer sequence is part of a flip chip. Flip Chip here means that the component is bonded directly to a carrier or printed circuit board. The person skilled in the art is aware of this, for example, from DE 10 2015 101 143 A1, the disclosure content of which is hereby taken up by withdrawal.

According to at least one embodiment, the flip chip has a sapphire carrier. Alternatively, the Flip Chip is part of a Chip Scale Package (CSP).

According to at least one embodiment, the semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, where $0 \leq n \leq$, $0 \leq m \leq 1$ and $n+m \leq 1$. The semiconductor layer sequence may contain dopants as well as additional components. For the sake of simplicity, however, only the essential components of the crystal lattice of the semiconductor layer sequence, i.e., Al, As, Ga, In, N or P, are given, even if these may be partially replaced and/or supplemented by small quantities of other substances.

The semiconductor layer sequence comprises one or more active layers. The at least one active layer is configured to generate electromagnetic radiation. For example, the active layer contains at least one pn transition or at least one quantum well structure. In particular, ultraviolet, visible and/or near infrared radiation is generated in the active layer during operation of the semiconductor component. The radiation generated in the active layer has a main wavelength. The peak wavelength is the wavelength at which the highest radiation intensity is generated during normal operation.

According to at least one embodiment, the semiconductor layer sequence is based on gallium nitride and comprises at least one n-doped semiconductor layer, at least one p-doped semiconductor layer and one active layer. Preferably, at least one vias extends at least regionally over the n-doped semiconductor layer, the p-doped semiconductor layer and the active layer.

According to at least one embodiment, the semiconductor layer sequence comprises an inorganic layer. The inorganic layer comprises silicon dioxide, silicon nitride, ITO (indium tin oxide) or aluminum oxide. The inorganic layer forms at least partially the main radiation exit surface.

According to at least one embodiment, the matrix material is a condensed monoaluminum phosphate or a condensed modified monoaluminum phosphate or a condensed aluminum phosphate.

According to at least one embodiment, the matrix material is a condensed water glass. Water glass is the term used to describe glass-like, amorphous, water-soluble sodium, potassium and/or lithium silicates or their aqueous solutions that have solidified from a melt. Water glass thus differs from conventional glass particularly in its properties such as porosity.

According to at least one embodiment, the matrix material is at least lithium water glass, sodium water glass, potassium water glass or a mixture thereof, wherein the conversion element comprises a chemical hardener. By adding a chemical hardener and curing the matrix material, for example, between a temperature of 150 to 350° C. for water glass, it is possible to produce a conversion element that is very stable to moisture. In particular, this conversion element shows a high stability at 85° C., 85% relative humidity and 1000 hours for the test duration, which was determined by means of a humidity test. The addition of the hardener results in the formation of a further by-product in addition to any alkali carbonate that may be formed. In the case of a phosphate hardener, this would be an alkali metal phosphate.

According to at least one embodiment, no chemical hardener is added to aluminum phosphate, monoaluminum phosphate or modified monoaluminum phosphate. Alternatively, a suitable chemical hardener can also be added here. The aluminum phosphate, monoaluminum phosphate or modified monoaluminum phosphate described here preferably has a molar ratio of Al to P of 1:3 to 1:1.5 and hardens in particular at temperatures between 300° C. and 350° C. The solutions may contain further elements or compounds, but preferably a maximum of 1 mol % of alkali and halogen compounds.

The water glass used for the matrix material may consist at least of lithium water glass, sodium water glass, potassium water glass or a mixture thereof, or may comprise alkali water glasses. The inventors have recognized that a combination of lithium water glass and potassium water glass in particular has excellent properties for the matrix material. Preferably, the ratio between lithium water glass and potassium water glass is between 1:3 and 3:1. In particular, the ratio between lithium water glass and potassium water glass is 1:3, 1:1 or 3:1, preferably 1:1.

For example, the alkali water glasses can have a modulus of 1.5 to 5, preferably a modulus of 2.5 to 4.5. The term modulus is known to a person skilled in the art and describes the molar ratio of $SiO_2$ to alkali oxide.

Preferably, a chemical hardener is added to water glass, such as potassium water glass.

For example, aluminum phosphate can be added to potassium water glass as a chemical hardener. The chemical hardening takes place by ion exchange, in this case potassium ions by aluminum ions. This means that aluminum ions are incorporated into the silicate network, which increases moisture resistance. Potassium phosphate is produced as a by-product.

According to at least one embodiment, the conversion element has a layer thickness of 20 m to 70 μm for partial conversion or 40 m to 150 μm for full conversion. In particular, the conversion element has a maximum layer thickness of 70 μm, better maximum 60 μm, preferably maximum 50 μm or maximum 45 μm or maximum 40 μm or maximum 35 m or maximum 30 μm or maximum 25 μm or maximum 20 μm for partial conversion. In particular, the conversion element for full conversion has a maximum layer thickness of 150 μm, better 130 μm, preferably 110 μm or 90 μm or 80 μm or 70 μm or 60 μm or 50 μm or 40 μm. Full conversion here means that the radiation of the semiconductor layer sequence does not contribute at all or contributes less than 5% to the resulting total radiation. The radiation of the semiconductor layer sequence can alternatively be partially absorbed, so that the total radiation emerging from the conversion element is composed of the radiation of the semiconductor layer sequence and the converted radiation. This can also be referred to as partial conversion. The total radiation can be white mixed light. The mixed light, for example, can be warm white or cold white.

According to at least one embodiment, the conversion material is selected from the following group: $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, α-SiAlON:$Eu^{2+}$, β-SiAlON:$Eu^{2+}$, $(Sr,Ca)S:Eu^2$, $(Sr,Ba,Ca)_2(Si,Al)_5(N,O)_8:Eu^{2+}$, $(Ca,Sr)_8Mg(SiO_4)_4Cl_2:Eu^{2+}$, $(Sr,Ba)Si_2N_2O_2:Eu^{2+}$.

According to at least one embodiment, the conversion material has quantum dots, for example, CdSe, InP, or ZnSe.

According to at least one embodiment, the conversion element has a layer thickness of 1 m to 150 μm. In particular, the conversion material may include or consist of quantum dots.

According to at least one embodiment, at least two different conversion materials are embedded in the matrix material.

According to at least one embodiment, the component emits radiation with a color temperature between 2500 K and 4500 K during operation. In addition, the color rendering index CRI can be between 70 and 100.

According to at least one embodiment, the component emits radiation with a color temperature between 4500 K and 8000 K during operation. In addition, the color rendering index CRI can be between 70 and 100.

According to at least one embodiment, the component does not emit white light but, for example, turquoise, green, yellow, orange, red or deep red light.

According to at least one embodiment, the condensed sol-gel material has a proportion between 10 Vol % and 70 Vol %. Preferably the sol-gel material has a proportion between 20 Vol % and 40 Vol %, especially if the optoelectronic component emits warm white mixed light. The proportion of matrix material in the conversion element, for example, is max. 70 Vol %, better max. 65 Vol %, preferably max. 60 Vol % or max. 55 Vol % or max. 50 Vol % or max. 45 Vol % or max. 40 Vol % or max. 35 Vol % or max. 30 Vol % or max. 25 Vol % or max. 20 Vol % or max. 15 Vol % or max. 10 Vol % or max. 5 Vol %. This corresponds, for example, to a weight proportion of max. 60 wt %, better max. 55 wt %, preferably max. 50 wt % or max. 45 wt % or max. 40 wt % or max. 35 wt % or max. 30 wt % or max. 25 wt % or max. 20 wt % or max. 15 wt % or max. 10 wt % or max. 5 wt % of matrix material in the conversion element. For example, the volume proportion of the matrix lies between 10 vol % and 65 vol % and the mass proportion between 5 wt % and 40 wt %. For example, the conversion material in the conversion element has a proportion of more than 50 wt %, better than 60 wt %, preferably more than 65 wt % or more than 70 wt % or more than 75 wt % or more wt % or more than 80 wt % or more than 85 wt % or more than 90 wt % or more than 95 wt %. The conversion material may have a volume proportion, for example, of more than 10 vol % or 20 vol %, better than 30 vol %, preferably more than 35 vol % or more than 40 vol % or more than 45 vol % or more than 50 vol % or more than 55 vol % or more than 60 vol % or more than 65 vol % or more than 70 vol % or more than 75 vol % in the conversion element. For example, the volume proportion is between 40 vol % and 85 vol % and the mass proportion between 60 wt % and 90 wt %. This can provide a conversion element that is very thin and has a high concentration of conversion material.

A method for producing an optoelectronic component is also given. The optoelectronic component described here is preferably produced using this method. All definitions and embodiments for the optoelectronic component also apply to the method and vice versa.

According to at least one embodiment, the method shows the steps: A) providing a semiconductor layer sequence comprising an active region which emits radiation at least via a main radiation exit surface during operation, B) directly applying a conversion element on the main radiation exit surface, wherein the matrix material consists of at least one solution of a sol-gel material in which the at least one conversion material is dispersed, C) Curing the arrangement produced in step B), possibly modification or processing, for example, smoothing, of a surface opposite the main radiation exit surface, D) separating the arrangement generated in step C) for generating the optoelectronic component.

Step D can produce a sharp cutting edge on the individual optoelectronic components.

According to at least one embodiment, the application in step B is done by one of the following methods: screen printing, stencil printing, dispensing, spin coating, electrophoretic coating (EPD), doctoring, spraying, dip coating.

Optionally, before or after separating, one or more further coatings can be applied to the surface and/or the edges of the conversion layer (if necessary also to the edges of the semiconductor layer sequence), for example, an anti-reflective coating or a dichroic coating or a passivation layer or an encapsulation layer.

The inventors have recognized that by using a conversion element described here in an inorganic optoelectronic component described here, the following advantageous properties can be achieved:

The conversion element, which preferably has no organic components and is directly connected to the semiconductor surface, is stable against the radiation emitted by the semiconductor layer sequence, in particular from a blue spectral range. In addition, the conversion element has a high thermal stability. The component can therefore be operated at higher operating currents. A higher brightness per semiconductor surface, i.e., a higher luminance, can be observed since the conversion element has a better thermal conductivity than conversion elements with a silicone matrix, which enables a higher current density. This makes it easier to dissipate the Stokes heat generated in the conversion material. The semiconductor layer sequence serves here as a so-called heat sink. Consequently, temperature-sensitive conversion materials can be used. In addition, there is less degradation, lower temperature quenching, and a wavelength shifting is avoided, which has a positive effect on efficiency, lifetime and/or color location stability (with temperature change). The conversion element can be applied directly to the semiconductor layer sequence.

The semiconductor layer sequence can also be part of a wafer composite. In other words, the conversion element can also be applied on a wafer scale, i.e., in a composite of optoelectronic components. This is more cost effective than applying each individual conversion element to each individual optoelectronic component or semiconductor layer sequence. Several conversion elements and optoelectronic components can therefore be produced simultaneously.

The use of a flip chip shows the advantage that both electrical contacts are located on the opposite side of the semiconductor layer sequence to the conversion element and the contacts are made there. Therefore, the conversion element does not have to have any areas to which, for example, a contact, such as a bond pad or bond wire, must be attached.

The matrix material shows a very good adhesive strength and is significantly less elastic than silicone. This enables cutting of the composite with good edge quality.

An organic matrix material is replaced by an inorganic condensed sol-gel material. At least one or more conversion materials can be embedded in this inorganic condensed sol-gel material. Conventional conversion materials such as phosphors based on oxides or nitrides are suitable as conversion materials. Alternatively, quantum dots with or without organic ligands or with or without inorganic coating, such as silicon dioxide, can also be used. With quantum dots, it is also possible to imagine significantly smaller layer thicknesses of, for example, smaller 50 µm or smaller 40 µm or smaller 30 µm or smaller 25 µm or smaller 20 µm or smaller 15 µm or smaller 10 µm or smaller 5 µm or smaller 2 µm.

Conversion materials, such as organic fluorescent or phosphorescent materials or perovskites or polymeric perovskites, fluorescent proteins, are also conceivable as conversion materials. Organic phosphors can also be used as conversion materials.

The sol-gel solution, paste or suspension, which consists of the sol-gel and at least one conversion material, can be applied directly to the main radiation exit surface of the semiconductor layer sequence, for example, of a flip chip, on a wafer-level scale. Alternatively, it can also be applied to individual chips that are already in a package, for example.

The sol-gel material has a low viscosity and can therefore be filled with a high degree of conversion material particles. After drying and curing, a conversion element results which is completely inorganic and has a high thermal conductivity compared to conversion materials in silicone as a matrix material. Due to the high filling level, the conversion element for the same conversion level can be thinner than less filled conversion elements. Since the conversion element described here can be applied directly, the layers can also be thinner than with free-standing conversion elements, which still require mechanical stability for subsequent handling such as gluing to the semiconductor layer surface. Due to the high degree of filling combined with the low layer thickness and the good thermal conductivity of the matrix, the conversion element has very good heat dissipation. A further thermal advantage results from the fact that the adhesive layer is not required and thus good heat dissipation to the semiconductor layer sequence. An adhesive layer is often based on adhesive materials such as silicone which have a comparatively low thermal conductivity, i.e., represent a thermal barrier.

Inorganic matrix materials have better stability to radiation emitted by the semiconductor layer sequence and to high temperatures, as well as better thermal conductivity compared to organic matrix materials such as silicone. As a result, the conversion elements described here can be operated at higher excitation powers and higher temperatures. If water glass, certain aluminum phosphates, monoaluminum phosphate or modified monoaluminum phosphate is used as the starting material for the inorganic condensed sol-gel material, a completely inorganic conversion element can be produced at low production temperatures. The conversion element may also comprise organic or partially organic sol-gel materials, for example, alkoxysilanes such as TMOS, TEOS, alkoxides or alkoxanes. The use of organic or partially organic functionalized sol-gel materials is possible, but not preferred, because a complete condensation of the sol-gel material does not occur at low temperatures and thus creates a risk to the stability of the component during the lifetime.

The matrix material, especially the sol-gel material, is produced at such temperatures to avoid damaging the semiconductor layer sequence or damaging or destroying sensitive conversion materials such as nitride phosphors. If a chemical hardener is added, good stability against moisture at 85° C., 85 percent relative humidity over 1000 hours, can be achieved even at relatively low temperatures, for example, less than or equal to 150° C., if water glass is used as the matrix material. After producing the component at low temperatures, the wafer can consist entirely of inorganic materials and has good chemical resistance.

The main radiation exit surface can be modified to increase the decoupling and adhesion between the matrix material, so the conversion element and the semiconductor layer sequence. For example, the main radiation exit surface can be treated with plasma or with an inorganic layer such as silicon dioxide, silicon nitride, ITO or aluminum oxide or a combination of several layers.

The semiconductor layer sequence can be surrounded by scattering particles, which are also embedded in a matrix material. The radiation emitted via the side surfaces of the semiconductor layer sequence can be reduced. For example, titanium dioxide particles can be used as scattering particles in a matrix material. The matrix material described here or an organic matrix material such as silicone can be used as the matrix material.

The optoelectronic component may have coatings. The coatings can, for example, include a scattering layer. This improves the angle-dependent dispersion characteristics. For example, partial conversion allows better mixing of the blue light emitted by the semiconductor layer sequence with the converted light.

The conversion element can be followed by a coating or encapsulation. This increases the stability against moisture. The protective layer can also be applied after a separation process, for example, by sawing, in order to also protect the edges of the conversion element. Suitable protective coatings are, for example, evaporated layers of, e.g., $SiO_2$ and/or $Al_2O_3$, especially layers applied by atomic layer deposition (ALD), or polymer or hybrid polymer layers of, for example, ormocer, polysilazane, polysiloxane, silicone, and/or parylene.

The optoelectronic component may have functional coatings such as antireflective coatings or filters. This allows, for example, the light extraction to be increased or reflection losses to be minimized. Dielectric filters can also be used that reflect wavelength-selectively, for example, preferably a part of the blue primary radiation while the secondary radiation is hardly reflected to produce a more homogeneous color location at different angles.

The coatings described here can be used individually in the optoelectronic component or in combination.

The conversion material can be embedded individually or as a mixture with several conversion materials in the matrix material. This allows the color location and color rendering index to be set. Warm white mixed light can be produced by combining a green emitting and a red emitting conversion material.

The conversion material can be configured as particles. Preferably the particles have an average diameter between 1 and 35 μm, in particular between 2 and 20 μm, preferably between 3 and 15 μm. This allows very thin conversion elements to be produced and improves heat dissipation and efficiency. By using very small particle sizes, for example, between 0.5 m and 5 μm or in the case of quantum dots of only a few nanometers, extremely thin layers can be produced in which the light hardly propagates sideways. For example, in multi-pixel LEDs with several adjacent main radiation exit surfaces, crosstalk from one pixel to the other can be largely avoided, this means if only one pixel is operated, the adjacent pixels remain relatively dark.

The conversion element may comprise a dopant or activator. The activator concentration can be used to set the desired color location.

According to at least one embodiment, at least one conversion element may have different conversion materials with different particle sizes. Conversion materials that contain larger particles and smaller particles can be mixed together and thus a dense packing and thus a thin conversion element are produced. Alternatively, the conversion material may also have a concentration gradient in the matrix material. For example, larger particles may be located close to the main radiation exit surface, while smaller particles may be located opposite the main radiation exit surface.

According to at least one embodiment, the conversion element comprises scattering particles or fillers. The scattering particles or fillers may be, for example, aluminum oxide, aluminum nitride, titanium dioxide, silicon dioxide, zinc oxide, zirconium dioxide, other ceramic and glassy particles, metal oxides or other inorganic particles. The scattering particles or fillers can have different shapes, for example, spherical, rod-shaped or disc-shaped, wherein the particle sizes ranges from a few nanometers to a few tens of micrometers. Smaller particles can be used to adjust the viscosity of the suspension. Larger particles can contribute to the production of a compact conversion element and/or to improved heat dissipation, moisture resistance, or thickness homogeneity. The scattering can be changed and/or the mechanical stability can be improved.

According to at least one embodiment, the conversion element comprises additives. An additive can be aerosil or silica, such as, for example, sipernate. This allows the viscosity of the suspension to be modified and the proportion between the liquid and solid components to be adjusted.

According to at least one embodiment, the first layer has several sublayers. In other words, the first layer can be formed in such a way that the first layer has several conversion materials arranged in different sublayers. The conversion materials can be embedded in the same or different matrix materials. The sublayers may differ in thickness, compactness, matrix material, conversion material, grain diameter, spreader and/or filler.

To configure a compact conversion element, it can be advantageous to create the conversion element in more than one step. For example, the first layer can have several sublayers that are produced one after the other and thus have a smaller layer thickness and can be produced more compactly than a single first layer.

Drying and curing can take place between the individual production steps of applying the sublayers. Since the conversion element has a certain porosity, a material such as a polymer such as silicone or polysilazane, or generally a material with low light absorption in the wavelength range of the excitation wavelength or the converted light, can be introduced into all pores.

The sol-gel material can have a different or different chemical composition. In comparison to the organic matrix material, the sol-gel material comprises no organic components and no volatile organic molecules after baking.

This offers a lot of advantages: The cured sol-gel material can form a glassy or polycrystalline oxide when the solvent is removed. The surface chemistry of a gold-plated surface of the wafer, the silica-passivated light-emitting areas or the chemistry of sol-gel materials can be adjusted so that in a sol-gel liquid phase the conversion element adheres well to a silica-passivated main radiation exit surface and thus adheres only slightly to the electrical contacts of gold during production, so before baking. This is advantageous if only certain areas are to be coated.

The conversion element can be applied over the entire surface of the main radiation exit surface, followed by lithographic structuring by removing a part of the conversion element, for example, the part that can be used for electrical contacting or for component separation. The structuring can be carried out wet-chemically, for example, with acids or alkalis or by means of plasma, for example, with chlorine or fluorine or alkali as reactive species.

The conversion element can be applied over the entire surface of pre-structured wafers. Pre-structuring can be used, for example, to cover the bond pads. Pre-structuring, for example, can be carried out lithographically. Once the conversion element has been applied and, if necessary, cured, the structuring can be removed so that there are areas on the wafer where no conversion element has been applied.

According to at least one embodiment, the conversion element is applied to the main radiation exit surface in such a way that the electrical contacts and/or the metallic areas are free of the conversion element. This can be done by self-assembling the conversion element. In other words, the polarity, this means hydrophilic and hydrophobic areas of the materials, are used here to influence the deposition of the conversion element.

According to at least one embodiment, the main radiation exit surface and/or the electrical contacts are made of materials with different polarity. Due to the polarity (depending on hydrophilicity or hydrophobicity) of the materials, the matrix material adheres differently to the respective areas. The hydrophilic/hydrophobic properties can be adjusted by plasma activation.

According to at least one embodiment, the wet chemical behavior of the sol of the matrix material can be modified and thus so-called Self Assembly Monolayers (SAM) can be produced. These materials typically consist of bi-functional molecules that have a chemical reactive anchor group. This chemically reactive anchor group reacts selectively either with the main radiation exit surface or with the electrical contacts. The bi-functional molecule may have a tail group that comprises a second reactive group attached to the sol-gel material. For example, reactive groups are R—SH, R—SeH, R—TeH, R—OH, R—COOH, R—$NH_2$, where R are alkanes or aromatics. Examples for the second reactive group of the tail group are R—$SiCl_3$, R—$SiH_xCl_y$, R—Si$(OH)_3$.

The main radiation exit surface may comprise silicon dioxide. The electrical contact can be made of gold. The sol can be an aqueous solution of potassium water glass. The assembly monolayers can comprise HS—$C_6H_{13}$. The thiol group binds selectively to the gold surface. After washing, the tail group, which may comprise alkanes, may cause the sol-gel material to adhere to the gold surface.

The sol-gel material can be doped with one or more metal ions. This can improve the electrical conductivity of the conversion element. It can also produce better current expansion and/or electrical contact on the main radiation exit surface. InGaN can be used as the semiconductor layer sequence.

BRIEF DESCRIPTION OF THE DRAWINGS

Further advantages, advantageous embodiments and developments of the invention result from the exemplary embodiments described in the following in connection with the figures.

FIGS. 1A to 1F show schematic side views of an optoelectronic component according to an embodiment; and FIGS. 2A to 2E show a method for producing an optoelectronic component according to an embodiment.

In the exemplary embodiments and figures, identical, similar or equivalent elements can each be provided with the same reference numbers. The represented elements and their proportions among each other are not to be regarded as true to scale. Rather, individual elements, such as layers, components, components and areas, can be displayed in an exaggeratedly large format for better representability and/or better understanding.

DETAILED DESCRIPTION OF ILLUSTRATIVE EMBODIMENTS

The FIGS. 1A to 1E each show an optoelectronic component according to an embodiment.

Figure 1A:
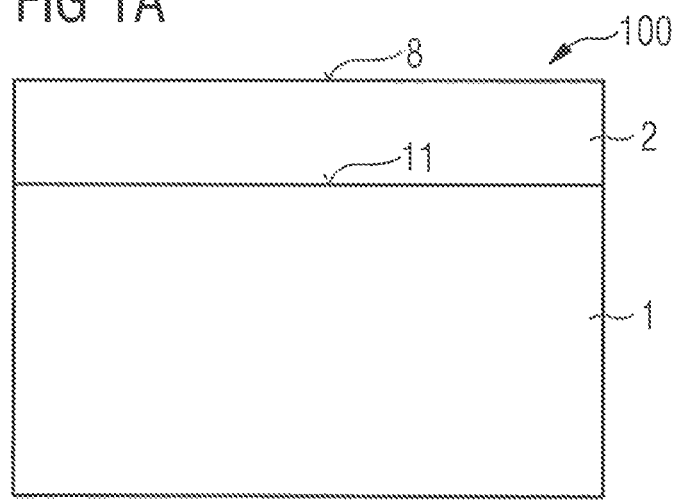

FIG. 1A shows a semiconductor layer sequence 1 with an active region that emits radiation at least over a main radiation exit surface 11 during operation. Preferably, the semiconductor layer sequence 1 emits radiation from the blue spectral range. The semiconductor layer sequence 1 can, for example, be made of InAlGaN. Conversion element 2 is arranged directly on the main radiation exit surface 11. Direct means here that conversion element 2 is arranged directly, this means without further layers or elements, for example, an adhesive layer, on the main radiation exit surface. The conversion element 2 is substrate free and comprises a first layer 22 (not shown here).

Figure 1B:
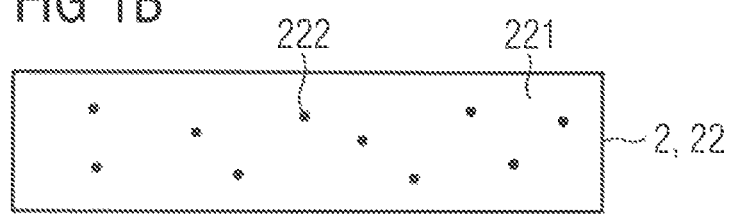

The first layer 22, as shown in FIG. 1B, comprises a matrix material 221 embedded with at least one conversion material 222. The matrix material 221 comprises or consists of at least one condensed inorganic sol-gel material. The sol-gel material can be, for example, water glass, metal phosphate, aluminum phosphate, monoaluminum phosphate or modified monoaluminum phosphate. The sol-gel material comprises a proportion between 10 Vol % and 70 Vol % in the first layer 22.

Figure 1C:
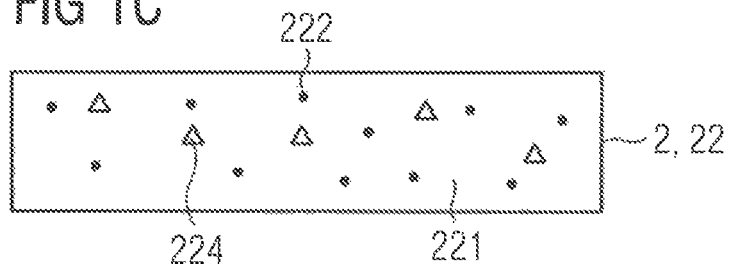

Alternatively, as shown in FIG. 1C, the conversion element 2 may have more than one conversion material. In the embodiment shown in FIG. 1C, two conversion materials 222, 224 are embedded in the matrix material 221. There may also be more than two conversion materials, for example, three, four or five conversion materials embedded in the matrix material 221.

Figure 1D:
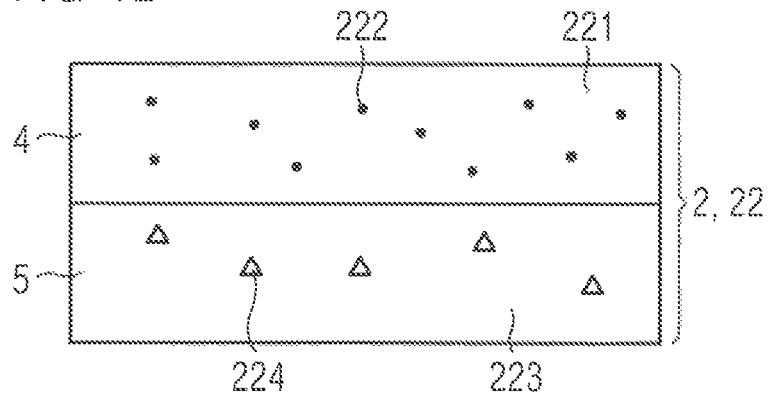

Alternatively, the first layer 22 can also comprise several sublayers, shown here in FIG. 1D using the example of two sublayers 4 and 5. The sublayer 4 comprises a matrix material 221 and the conversion material 222. Conventional conversion materials can be used as conversion material 222. The sublayer 5 comprises the matrix material 223 and the conversion material 224. The conversion materials 222, 224 are each embedded in the matrix material. The matrix materials 221, 223 can be the same or different. The conversion materials 222, 224 can be the same or different.

FIG. 1E shows an optoelectronic component 100 according to an embodiment, which is formed as a so-called flip chip. The flip chip comprises a semiconductor layer sequence 1. The conversion element 2 is arranged above the semiconductor layer sequence 1. Contacts 9 are arranged opposite the main radiation exit surface 11 and serve for electrical contacting of the semiconductor layer sequence 1. In this case, two contacts are arranged, both on the side facing away from the main radiation exit surface 11.

Alternatively, the semiconductor layer sequence 1 may also be part of a semiconductor chip having vias 9 and arranged on a carrier 21. In particular, the contacts extend over a p-doped semiconductor layer 114, n-doped semiconductor layer 113 and the active layer 112 (FIG. 1F).

FIGS. 2A to 2E show a method for producing an optoelectronic component. In particular, the optoelectronic component 100 is produced in a composite, so a plurality of optoelectronic components 100.

Figure 2A:

FIG. 2A shows the provision of an auxiliary carrier 10. The auxiliary carrier comprises, for example, a metal plate laminated onto a double-sided adhesive film. The semiconductor layer sequence 1 or semiconductor chips can be fixed to the double-sided adhesive film. The auxiliary carrier 10 can be a silicon wafer or a wafer in general.

Figure 2B:
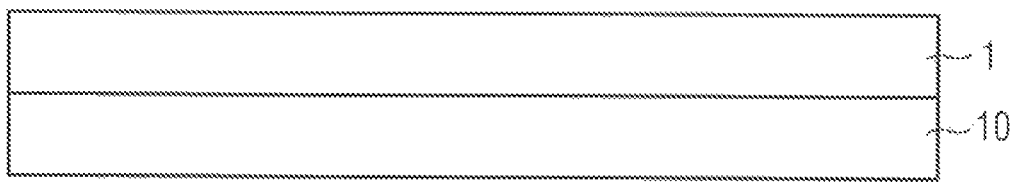

As shown in FIG. 2B, the semiconductor layer sequence 1 can be applied epitaxially to the auxiliary carrier 10. The application can take place over the entire surface.

Figure 2C:
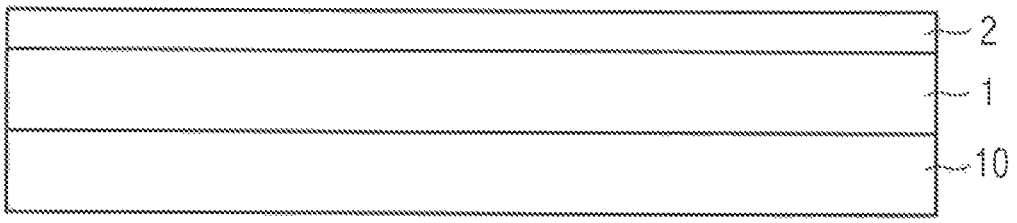

After applying the semiconductor layer sequence 1, the conversion element 2 can be applied over the entire surface of the semiconductor layer sequence 1, as shown in FIG. 2C.

Afterwards the auxiliary carrier 10 can be removed again.

Figure 2D:
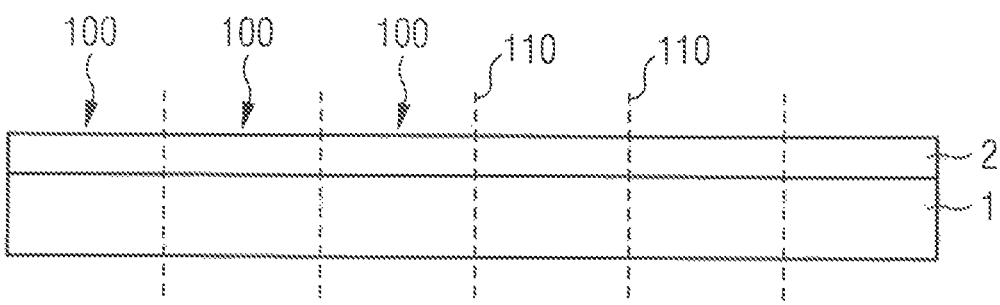

FIG. 2D shows the separation 110, so that a plurality of optoelectronic components 100 are generated simultaneously. The materials for the semiconductor layer sequence 1 and the conversion element 2 may comprise the materials described herein.

FIG. 2E shows the top view of a composite of optoelectronic components 100 arranged in a matrix.

Exemplary Embodiment 1: Water Glass as Matrix Material

A suspension is prepared from a potassium water glass solution, aluminum phosphate powder as chemical hardener and a garnet fluorescent powder (YAG:Ce), which can optionally be diluted with water. The mass ratio of solid to liquid components varies between 1 to 2 and 1 to 0.3. The radiation exit surface of a flip-chip wafer segment is directly coated with the suspension, for example, by means of Doctor-Blade process. The wet layer thickness is between 15 µm and 150 µm, better between 20 µm and 100 µm, preferably between 25 µm and 90 µm. The layers are then dried and hardened at 150° C. for 2 hours. In this case potassium phosphate is formed as a by-product. As an alternative to the wafer segment, a complete wafer, for example, 4 or 6 inches, can also be coated.

Exemplary Embodiment 2: Mixed Water Glass as Matrix Material

A suspension is prepared from a potassium water glass solution (KWG), a lithium water glass solution (LiWG) and a garnet phosphor powder (YAG:Ce), which can optionally be diluted with water. The mass ratio of the two water glass solutions is between 1 and 99 wt % LiWG and 99 to 1 wt % KWG, better between 10 to 90 wt % LiWG and 90 to 10 wt % KWG, particularly between 25 to 75 wt % LiWG and 75 to 25 wt % KWG, ideally between 40-60 wt % LiWG and 60-40 wt % KWG. The mass ratio of solid to liquid components is in a similar range as in the exemplary embodiment 1. The production, this means the coating and temperature treatment, is also comparable with exemplary embodiment 1.

Exemplary Embodiment 3: Water Glass as Matrix Material

The exemplary embodiment 3 corresponds to the exemplary embodiment 1, but a warm white phosphor mixture (for example, LuAG:Ce and CaAlSiN:Eu) was used.

Exemplary Embodiment 4: Mixed Water Glass as Matrix Material

The exemplary embodiment 4 corresponds to the exemplary embodiment 2, but a warm white phosphor mixture (for example, YAG:Ce and CaAlSiN:Eu) was used.

Exemplary Embodiment 5: Water Glass as Matrix Material

The exemplary embodiment 5 corresponds to the exemplary embodiment 1, but a neutral white phosphor mixture (for example, YAG:Ce, LuAG:Ce and CaAlSiN:Eu) was used.

The water glass can also be hardened at higher temperatures if the substrate (semiconductor) or the embedded phosphor is not damaged.

Exemplary Embodiment 6: Aluminum Phosphate as Matrix Material

A suspension is produced from a modified monoaluminum phosphate solution and a garnet phosphor powder (LuAG:Ce), which can optionally be diluted with water.

The mass ratio of solid to liquid components varies between 1 to 2 and 1 to 0.3. The radiation exit surface of a flip-chip wafer segment is directly coated with the suspension, for example, by means of Doctor-Blade process. The wet layer thickness is between 15 m and 150 µm, better between 20 µm and 100 m, preferably between 25 µm and 90 m. The layers are then dried and hardened at 300° C. or 350° C. for 2 hours. As an alternative to the wafer segment, a complete wafer, for example, 4 or 6 inches, can be coated or another chip type can be coated.

The exemplary embodiments described in connection with the figures and their features can also be combined with each other according to further exemplary embodiments, even if such combinations are not explicitly shown in the figures. Furthermore, the exemplary embodiments described in connection with the figures may have additional or alternative features as described in the general part.

The invention is not limited by the description based on the exemplary embodiments of these. Rather, the invention includes any new feature as well as any combination of features, which in particular includes any combination of features in the patent claims, even if this feature or combination itself is not explicitly mentioned in the patent claims or exemplary embodiments.

The invention claimed is:

1. An optoelectronic component comprising:
 a semiconductor layer sequence having an active region configured to emit radiation at least via a main radiation exit surface; and
 a conversion element arranged directly downstream of the main radiation exit surface,
 wherein the conversion element is substrate-free, free of fillers and comprises a first layer,
 wherein the first layer comprises at least one conversion material embedded in a matrix material,
 wherein the matrix material comprises at least one condensed inorganic sol-gel material selected from the group consisting of water glass, metal phosphate, aluminum phosphate, modified monoaluminum phosphate, monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane, metal oxide, metal silicates, metal sulfates, and tungstates, and
 wherein the condensed sol-gel material has a proportion between 10 and 70 vol % in the first layer.

2. The optoelectronic component according to claim 1, wherein the conversion element adheres to the main radiation exit surface without an adhesive.

3. The optoelectronic component according to claim 1, wherein the optoelectronic component is free of organic material.

4. The optoelectronic component according to claim 1, wherein the semiconductor layer sequence comprises an inorganic layer of $SiO_2$, silicon nitride, ITO or aluminum oxide, and wherein the inorganic layer forms at least partially the main radiation exit surface.

5. The optoelectronic component according to claim 1, wherein the matrix material is condensed monoaluminum phosphate, condensed modified monoaluminum phosphate or condensed aluminum phosphate.

6. The optoelectronic component according to claim 1, wherein the matrix material is condensed water glass.

7. The optoelectronic component according to claim 1, wherein the matrix material comprises at least lithium water glass, sodium water glass, potassium water glass or a mixture thereof, and wherein the conversion element comprises a chemical hardener.

8. The optoelectronic component according to claim 1, wherein the conversion element comprises a layer thickness of 20 µm to 70 µm for partial conversion and 40 µm to 150 µm for full conversion.

9. The optoelectronic component according to claim 1, wherein the conversion element comprises a layer thickness of 1 µm to 150 µm, and wherein the conversion material comprises quantum dots.

10. The optoelectronic component according to claim 1, wherein the at least one conversion material is selected from the group consisting of $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, $\alpha$-SiAlON:$Eu^{2+}$, $\beta$-SiAlON:$Eu^{2+}$, $(Sr,Ca)S:Eu^{2}$, $(Sr,Ba,Ca)_2(Si,Al)_5(N,O)_8:Eu^{2+}$, $(Ca,Sr)_8Mg(SiO_4)_4Cl_2:Eu^{2+}$, $(Sr,Ba)Si_2N_2O_2:Eu^{2+}$, CdSe, InP, and ZnSe.

11. The optoelectronic component according to claim 1, wherein at least two different conversion materials are embedded in the matrix material.

12. The optoelectronic component according to claim 1, wherein the optoelectronic component is configured to emit the radiation with a color temperature between 2500K and 4500K.

13. The optoelectronic component according to claim 1, wherein the optoelectronic component is configured to emit the radiation with a color temperature between 4500K and 8000K.

14. The optoelectronic component according to claim 1, wherein the condensed sol-gel material comprises a proportion between 20 and 50 vol %.

15. The optoelectronic component according to claim 1, wherein the conversion element is free of fillers and scattering particles.

16. A method for producing the optoelectronic component according to claim 1, the method comprising:
providing the semiconductor layer sequence;
directly applying the conversion element on the main radiation exit surface, wherein the matrix material comprises at least one solution of a sol-gel material in which the conversion material is dispersed;
curing the semiconductor layer sequence and the conversion element; and
separating the cured semiconductor layer sequence and the cured conversion element generated for generating the optoelectronic component.

17. The method according to claim 16, wherein directly applying the conversion element is carried out by one of the following methods: screen printing, dispensing, spin coating, electrophoretic coating, doctoring, spraying, or dip coating.

18. An optoelectronic component comprising:
a semiconductor layer sequence having an active region configured to emit radiation at least via a main radiation exit surface; and
a conversion element arranged directly downstream of the main radiation exit surface,
wherein the conversion element is substrate-free and comprises a first layer, wherein the first layer comprises at least one conversion material embedded in a matrix material,
wherein the matrix material comprises at least one condensed inorganic sol-gel material selected from the group consisting of water glass, metal phosphate, aluminum phosphate, modified monoaluminum phosphate, monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane, metal oxide, metal silicates, metal sulfates and tungstates,
wherein the condensed sol-gel material has a proportion between 10 and 70 vol % in the first layer, and
wherein the semiconductor layer sequence is part of a flip chip.

19. The optoelectronic component according to claim 18, wherein the flip chip comprises a sapphire carrier or is part of a chip scale package (CSP).

20. An optoelectronic component comprising:
a semiconductor layer sequence having an active region configured to emit radiation at least via a main radiation exit surface; and
a conversion element arranged directly downstream of the main radiation exit surface,
wherein the conversion element is substrate-free and comprises a first layer,
wherein the first layer comprises at least one conversion material embedded in a matrix material,
wherein the matrix material comprises at least one condensed inorganic sol-gel material selected from the group consisting of water glass, metal phosphate, aluminum phosphate, modified monoaluminum phosphate, monoaluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane, metal oxide, metal silicates, metal sulfates and tungstates,
wherein the condensed sol-gel material has a proportion between 10 and 70 vol % in the first layer, and
wherein the optoelectronic component is configured to emit the radiation with a color temperature between 2500K and 4500K or between 4500K and 8000K.

* * * * *